(12) United States Patent
Uehara

(10) Patent No.: US 8,059,077 B2
(45) Date of Patent: Nov. 15, 2011

(54) DISPLAY DEVICE AND MANUFACTURING METHOD OF DISPLAY DEVICE

(75) Inventor: Junichi Uehara, Mobara (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 428 days.

(21) Appl. No.: 12/429,244

(22) Filed: Apr. 24, 2009

(65) Prior Publication Data

US 2009/0295696 A1 Dec. 3, 2009

(30) Foreign Application Priority Data

Apr. 24, 2008 (JP) ................................. 2008-114683

(51) Int. Cl.
*G09G 3/36* (2006.01)
(52) U.S. Cl. ................... 345/92; 438/34; 257/E21.535; 257/E27.131
(58) Field of Classification Search .................. 345/92; 438/34, 149, 151; 349/42, 43, 54; 257/E21.22, 257/E21.535, E27.131, E27.132, E29.117, 257/E29.32, 59, 72
See application file for complete search history.

(56) References Cited

U.S. PATENT DOCUMENTS 7,330,235 B2 * 2/2008 Hsiao ........................... 349/155

FOREIGN PATENT DOCUMENTS

JP 09-258244 10/1997

* cited by examiner

*Primary Examiner* — Abbas Abdulselam
(74) *Attorney, Agent, or Firm* — Antonelli, Terry, Stout & Kraus, LLP.

(57) ABSTRACT

A display device which can ensure the correction of a black spot, for example, in forming an opening portion in a portion of a scanning signal line where the scanning signal line intersects a video signal line and forming a semiconductor layer and a conductor layer by a resist reflow method is provided. A conductor layer includes a video signal line, a drain electrode, a source electrode, and a connecting line. A semiconductor layer is formed so as to cover at least a region of the insulation film which is larger than a region where the video signal line and the connecting line are formed. The connecting line is connected with the video signal line over an opening portion which is formed in the scanning signal line. A cutout portion, a projecting portion or an enlarged-width portion is formed on the video signal line and/or the connecting line in a region which corresponds to the opening portion or in the vicinity of the region.

12 Claims, 11 Drawing Sheets

DISPLAY DEVICE AND MANUFACTURING METHOD OF DISPLAY DEVICE

The present application claims priority from Japanese application JP2008-114683 filed on Apr. 24, 2008, the content of which is hereby incorporated by reference into this application.

BACKGROUND OF THE INVENTION

1. Field of the Invention

The present invention relates to a display device which performs a display control of pixels using thin film transistors (TFTs) and a manufacturing method thereof.

2. Description of the Related Art

For example, among various display devices including a liquid crystal display device, there has been known a display device which performs a display control of respective pixels by an active matrix drive method using thin film transistors. In such a display device, a plurality of scanning signal lines and a plurality of video signal lines are arranged on a substrate (hereinafter, referred to as a TFT substrate) in a stereoscopically intersecting manner. Here, respective intersecting points of the scanning signal lines and the video signal lines correspond to the pixels of the display device. A portion of the scanning signal line functions as a gate electrode of the thin film transistor, and either one of a drain electrode and a source electrode (the drain electrode in the explanation made hereinafter) of the thin film transistor is connected to the video signal line. Further, a pixel electrode is connected to the electrode of the thin film transistor which is not connected to the video signal line (source electrode in the explanation made hereinafter). Due to such constitution, by applying voltages to both of the scanning signal line and the video signal line corresponding to the pixel to which a display control is applied, the voltages are applied to the corresponding pixel electrode via the thin film transistor which functions as a switching element so that a display control of the pixel can be performed.

To form such a thin film transistor, it is necessary to stack the scanning signal lines, insulation layers, semiconductor layer, and a conductor layer on the TFT substrate in this order. Here, the conductor layer is a layer which includes the video signal lines, the drain electrodes and the source electrodes. To form these scanning signal lines, semiconductor layers and conductor layer having desired patterns respectively on the TFT substrate, a so-called photolithography technique can be used. According to this technique, a resist material is applied to a surface of a material film for forming an object by coating, the resist material is processed in a pattern of an object to be formed by exposure and development, and a film to be formed is etched using the processed resist material as a mask thus forming the scanning signal lines, the semiconductor layer and the conductor layer having desired patterns.

Further, in forming the semiconductor layers and the conductor layer by performing exposure one time, a resist reflow method may be adopted (see JP-A-2002-90779 (corresponding US patent; U.S. Pat. No. 6,933,989B2) (patent document 1), for example). In this method, a film made of a semiconductor material and a film made of a conductor material are sequentially stacked on a TFT substrate on which scanning signal lines and an insulation film are formed, the film made of the conductor material is formed into conductor layers of a desired pattern by the above-mentioned technique and, thereafter, a resist material remaining on the conductor layers is melted. Due to such steps, the resist material covers a region which is larger than a region on which the conductor layer is formed. By further etching the film made of the semiconductor material using the spread resist material as a mask, the semiconductor layer is formed into a shape which includes a region where the conductor layer is formed without exposing the resist material.

Further, in a display device having the above-mentioned type of thin film transistor, an opening portion may be formed in a portion of a scanning signal line where the scanning signal line intersects with the video signal line (see JP-A-9-258244 (patent document 2), for example). By forming the opening portion in the scanning signal line, the scanning signal line is bifurcated at the portion where the opening portion is formed so that, as viewed in a plan view, the respective branched or bifurcated scanning signal lines intersect with the video signal line. Due to such constitution, even when the scanning signal line and the video signal line are short-circuited with each other at an intersecting portion during a manufacturing process by a chance, by cutting one scanning signal line on a side where the scanning signal line is short-circuited with the video signal line out of these bifurcated or branched scanning signal lines using, for example, laser beams such that portions of one scanning signal line on both sides of the video signal line are cut, it is possible to cut off only the portion which is short-circuited with the video signal line from the whole scanning signal line. Further, the conductor layer may be formed such that a connecting line which connects the video signal line and the drain electrode of the thin film transistor is branched from the video signal line above the opening portion. Due to such constitution, when it is necessary to correct a black spot of a certain pixel, it is possible to separate the video signal line and the thin film transistor from each other by cutting the connecting line which connects the drain electrode of the thin film transistor corresponding to the pixel and the video signal line above the opening portion using laser beams, for example.

SUMMARY OF THE INVENTION

When the opening portion is formed in the portion of the scanning signal line where the scanning signal line and the video signal line intersect with each other, and the semiconductor layer and the conductor layer are formed by a resist reflow method as described above, the semiconductor layer covers a region which is larger than the conductor layer. Further, around a portion where the conductor layer forms an approximately acute-angled pattern as in the case of a portion where the connecting line is branched from the video signal line, for example, due to an action such as a surface tension which is generated when the resist material is melted, the resist material is liable to easily collect compared to other portions and hence, the semiconductor layer is liable to be easily formed in a wide range. Accordingly, when the semiconductor layer is formed so as to close the opening portion, there may be a case where it is difficult to perform the above-mentioned correction of the black spot where the connecting line is cut off at the opening portion or the above-mentioned correction which cuts off the scanning signal line which is short-circuited with the video signal line out of the scanning signal lines bifurcated or branched by the opening portion.

FIG. 13 is a plan view of a part of a TFT substrate showing the structure of a peripheral portion of a thin film transistor in a state that an opening portion is closed in the above-mentioned manner. FIG. 13 shows the positional relationship among a scanning signal line GL in which the opening portion AP is formed, a semiconductor layer AS, a video signal line DL, a drain electrode DE and a source electrode SE of a thin film transistor T, and a connecting line LL which connects the drain electrode DE and the video signal line DL with each other, all of which are formed on the TFT substrate. For example, in performing the correction of a black spot (in separating the video signal line DL and the drain electrode DE), it is necessary to cut off the connecting line LL including the semiconductor layer AS. Accordingly, it is necessary to perform cutting using laser beams or the like by setting positions in the inside of the opening portion AP where the semiconductor layer AS is not formed as a start point and a finish point. In this respect, when the semiconductor layer AS is formed so wide to occupy a most region of the opening portion AP on a side where the connecting line LL is arranged as shown in FIG. 13, it is difficult to sufficiently ensure the spatial tolerance for cutting the connecting line LL including the semiconductor layer AS in the inside of the opening portion AP. In the same manner, it is difficult to sufficiently ensure the spatial tolerance in the inside of the opening portion AP when one scanning signal line GL which is short-circuited with the video signal line DL is cut off out of the scanning signal lines GL which are bifurcated or branched by the opening portion AP.

As one of methods for overcoming such a drawback, a size of the opening portion AP may be increased along the direction that the scanning signal line GL extends to a position at which the resist material which is melted and spreads cannot arrive. However, when a size of the opening portion AP is increased in the direction that the scanning signal line GL extends in this manner, electric resistance of the scanning signal line GL is increased corresponding to the increase of the size of the opening portion AP. Further, a distance between the video signal line DL and the thin film transistor T is increased and hence, the limitation is imposed on the reduction of area per one pixel whereby the enhancement of high resolution of the whole display device is impeded.

The present invention has been made in view of the above-mentioned drawbacks, and it is an object of the present invention to provide a display device which can, in forming an opening portion in a portion of a scanning signal line where the scanning signal line intersects a video signal line and forming a semiconductor layer and a conductor layer by a resist reflow method, ensure a repair which cuts off a connecting line for connecting a drain electrode or a source electrode of a thin film transistor with a video signal line in the inside of the opening portion or a repair which cuts off one of scanning signal lines bifurcated or branched by the opening portion, for example, and a manufacturing method of the display device.

To overcome the above-mentioned drawbacks, according to a first aspect of the present invention, there is provided a display device in which scanning signal lines, an insulation film, semiconductor layers, and conductor layers are sequentially stacked on a substrate, wherein the conductor layer includes a video signal line which intersects the scanning signal line via the insulation film, a drain electrode and a source electrode of a thin film transistor, and a connecting line which connects the video signal line and either one of the drain electrode and the source electrode, the semiconductor layer is formed so as to cover at least a region of the insulation film which is larger than a region where the video signal line and the connecting line are formed, an opening portion is formed in the scanning signal line such that the opening portion overlaps with a portion of the video signal line, the connecting line is connected with the video signal line over the opening portion, extends to the outside of the opening portion, and is connected to either one of the drain electrode and the source electrode, and a cutout portion, a projecting portion or an enlarged-width portion is formed on the video signal line and/or the connecting line in a region which corresponds to the opening portion or in the vicinity of the region.

In the above-mentioned display device of the present invention, the cutout portion may be formed in a connecting portion which connects the video signal line and the connecting line.

In the above-mentioned display device of the present invention, the projecting portion may be formed on the video signal line on a side opposite to a side where the connecting line is connected to the video signal line.

In the above-mentioned display device of the present invention, the projecting portion may be formed on the connecting line outside the region which corresponds to the opening portion and in the vicinity of the opening portion.

In the above-mentioned display device of the present invention, the projecting portion may be formed at a connecting portion which connects the video signal line and the connecting line.

In the above-mentioned display device of the present invention, the enlarged-width portion which gradually increases a width thereof toward the video signal line may be formed on the connecting line in a region within a predetermined distance from a connecting end of the connecting line with the video signal line.

Further, according to a second aspect of the present invention, there is provided a manufacturing method of a display device which includes the steps of: forming conductor layers each of which includes a video signal line which intersects with a scanning signal line by way of an insulation film, a drain electrode and a source electrode of a thin film transistor and a connecting line which connects the video signal line with either one of the drain electrode and the source electrode by etching a conductor material for forming the conductor layer using a resist material which is formed by patterning on a stacked structure which is formed by sequentially stacking the scanning signal line, the insulation film, a semiconductor material for forming semiconductor layer and the conductor material on a substrate; and forming the semiconductor layer by melting the resist material remaining on the conductor layer after forming the conductor layer, and by etching the semiconductor material using the resist material in a molten state as a mask, wherein an opening portion is formed in the scanning signal line such that the opening portion overlaps with a portion of the video signal line, the connecting line is connected with the video signal line over the opening portion, and extends to the outside of the opening portion and is connected to either one of the drain electrode and the source electrode, and the resist material is formed by patterning such that the video signal line or/and the connecting line includes a cutout portion, a projecting portion or an enlarged-width portion for controlling spreading of the resist material in the opening portion when the resist material is melted.

In the above-mentioned manufacturing method of a display device of the present invention, the resist material may be formed by patterning such that the cutout portion is formed in a connecting portion which connects the video signal line and the connecting line.

In the above-mentioned manufacturing method of a display device of the present invention, the resist material may be formed by patterning such that the projecting portion is formed on the video signal line on a side opposite to a side where the connecting line is connected to the video signal line.

In the above-mentioned manufacturing method of a display device of the present invention, the resist material may be formed by patterning such that the projecting portion is formed on the connecting line outside the region which corresponds to the opening portion and in the vicinity of the opening portion.

In the above-mentioned manufacturing method of a display device of the present invention, the resist material may be formed by patterning such that the projecting portion is formed at a connecting portion which connects the video signal line and the connecting line.

In the above-mentioned manufacturing method of a display device of the present invention, the resist material may be formed by patterning such that the enlarged-width portion which gradually increases a width thereof toward the video signal line is formed in a region within a predetermined distance from a connecting end of the connecting line with the video signal line.

According to the present invention, in forming the opening portion in the portion of the scanning signal line where the scanning signal line intersects the video signal line and forming the semiconductor layer and the conductor layer by a resist reflow method, it is possible to surely perform a repair which cuts off the connecting line for connecting the drain electrode or the source electrode of the thin film transistor to the video signal line in the opening portion or a repair which cuts off one of bifurcated or branched scanning signal lines by the opening portion, for example.

DESCRIPTION OF THE PREFERRED EMBODIMENTS

Hereinafter, embodiments of a display device according to the present invention are explained in detail in conjunction with drawings. Hereinafter, the explanation is made with respect to a case where the present invention is applied to a so-called IPS (In Plane Switching)-type liquid crystal display device.

First Embodiment

A display device of this embodiment according to the present invention is a liquid crystal display device which is constituted of a TFT substrate on which scanning signal lines, video signal lines, thin film transistors, pixel electrodes and common electrodes are mounted, a filter substrate which faces the TFT substrate in an opposed manner and on which color filters are mounted, and a liquid crystal material which is hermetically filled into a region sandwiched between the TFT substrate and the filter substrate. Both of the TFT substrate and the filter substrate are formed of a glass substrate or the like.

Figure 1:
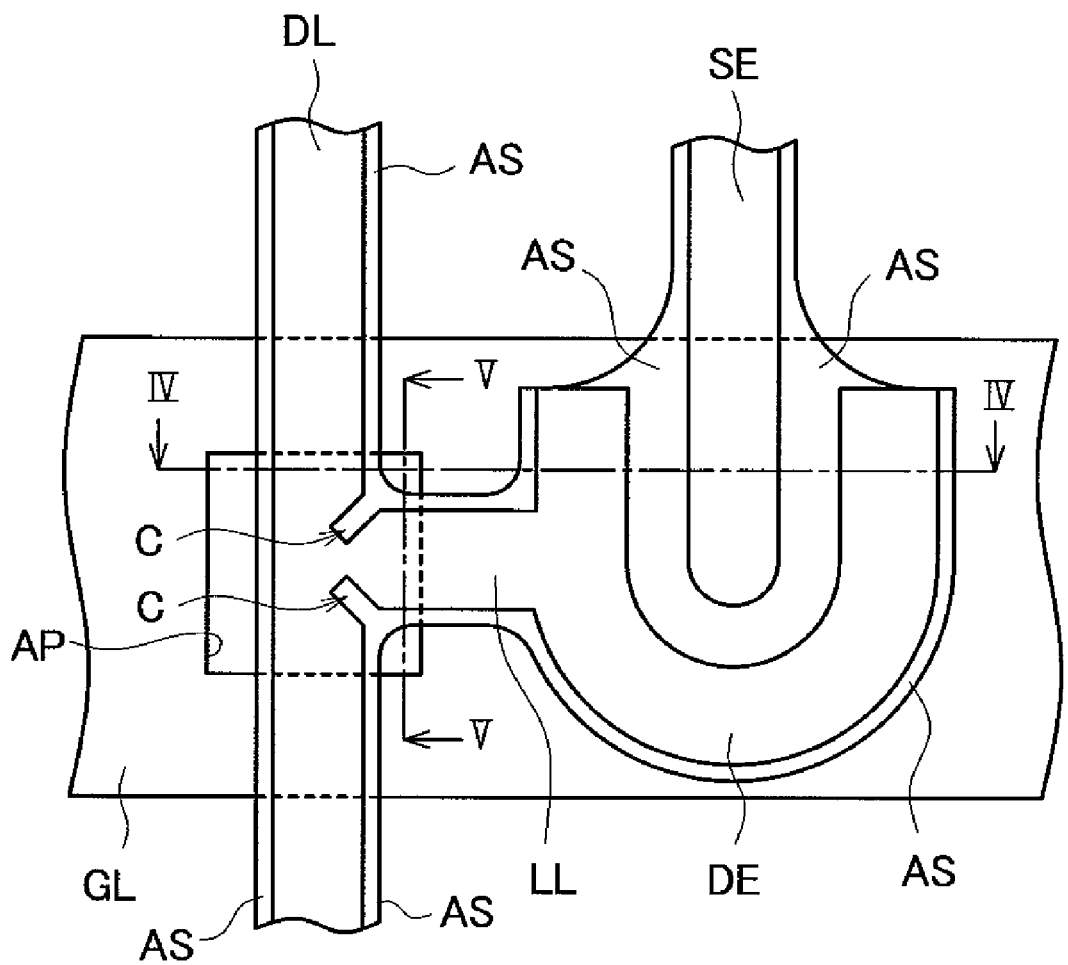
FIG. 1 is a partial plan view of a TFT substrate of a display device according to a first embodiment of the present invention.
Figure 2:
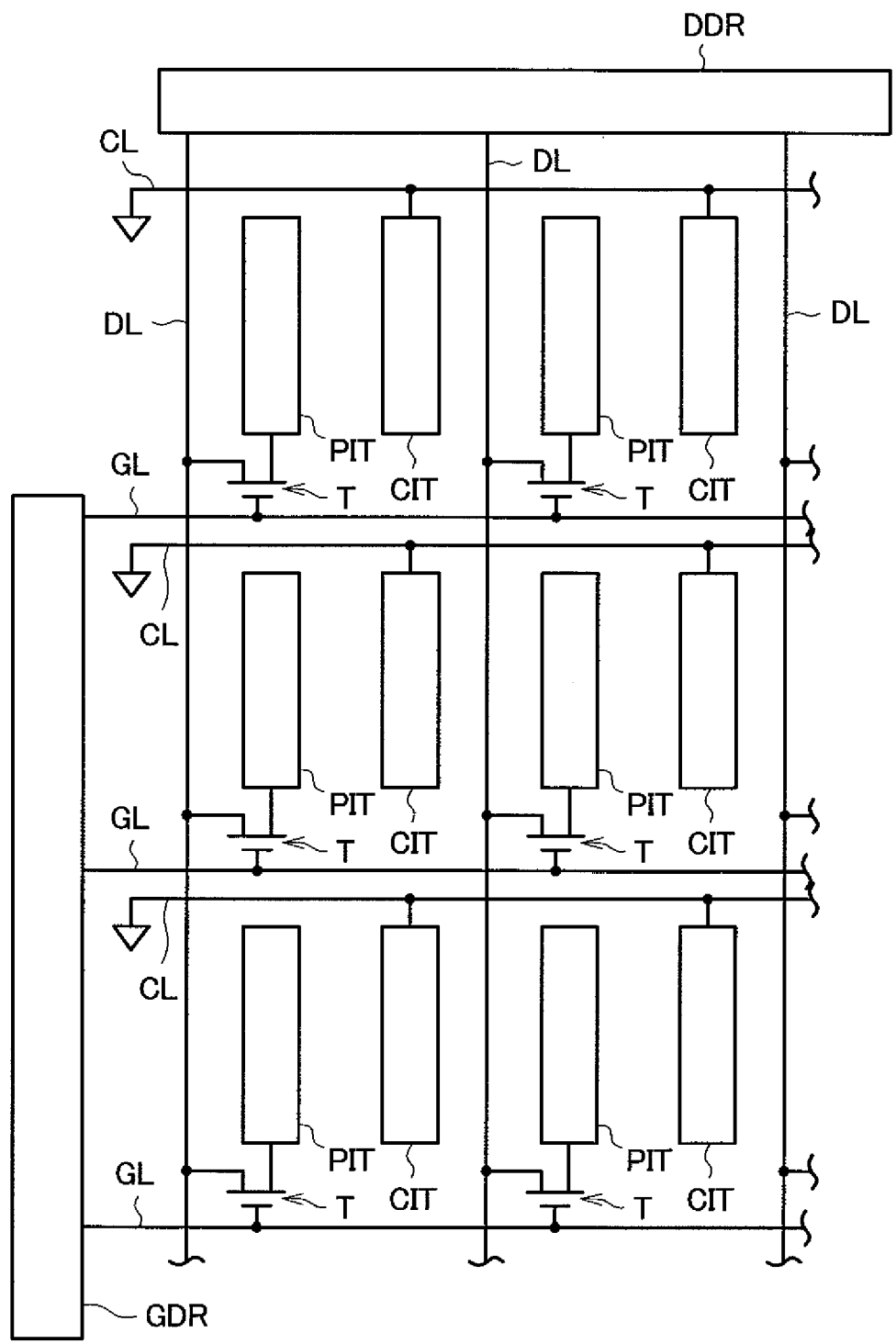
FIG. 2 is a circuit diagram showing the circuit constitution mounted on the TFT substrate of the display device according to the first embodiment of the present invention.
Figure 3:
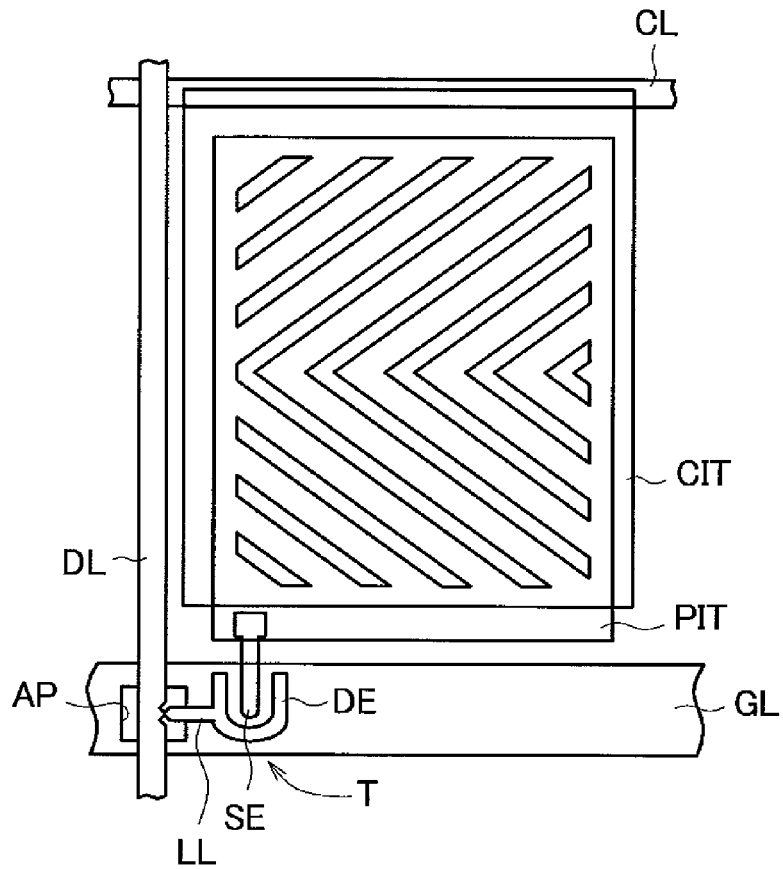
FIG. 3 is a plan view showing a pixel region of the TFT substrate.

FIG. 1 is a partial plan view of a TFT substrate which shows the positional relationship among the scanning signal line GL, the video signal line DL, the connecting line LL and the thin film transistor T on the TFT substrate. Further, FIG. 2 is a circuit diagram showing the schematic constitution of a circuit consisting of the scanning signal lines GL, the video signal lines DL, the thin film transistors T, the pixel electrodes PIT, common signal lines CL and common electrodes CIT which are mounted on the TFT substrate. Further, FIG. 3 is a plan view of one pixel region of the TFT substrate.

As shown in these drawings, a plurality of scanning signal lines GL which are arranged parallel to each other are mounted on the TFT substrate. Further, a plurality of video signal lines DL are arranged parallel to each other and are arranged so as to approximately orthogonally intersect with the plurality of respective scanning signal lines GL as viewed in a plan view. Pixels which are arranged in a matrix array are defined by these scanning signal lines GL and video signal lines DL. Respective intersecting portions where the scanning signal lines GL and the video signal lines DL intersect with each other correspond to the pixels of the display device according to this embodiment.

Further, on each of the plurality of pixel regions which are defined by the scanning signal lines GL and the video signal lines DL, the thin film transistor T which performs a display control of the pixel is formed. A gate electrode of the thin film transistor T is constituted of a part of the scanning signal lines GL, a drain electrode DE of the thin film transistor T is connected to the video signal lines DL via the connecting line LL, and a source electrode SE is connected to a pixel electrode PIT. On the other hand, a common electrode CIT which corresponds to each pixel electrode PIT is connected with any one of a plurality of common signal lines CL which are arranged parallel to the respective scanning signal lines GL. Although the drain electrode DE has a U shape in this embodiment, the drain electrode DE may have other shape.

In the display device of this embodiment, a voltage is selectively applied to the scanning signal line GL for every predetermined timing by a scanning signal line driver circuit GDR, and a voltage is selectively applied to the video signal line DL for every predetermined timing by a video signal line driver circuit DDR. In this manner, an ON/OFF state of the thin film transistor T corresponding to the pixel electrode which becomes an object of a display control is controlled, and a voltage is applied to the pixel electrode PIT of the pixel which constitutes a display object via the thin film transistor T. Accordingly, the display device of this embodiment performs a display control for every pixel by controlling liquid crystal molecules using an electric field generated between the pixel electrode PIT and the common electrode CIT. Here, both of the pixel electrode PIT and the common electrode CIT are formed of a transparent electrode film, and are arranged such that at least portions of these electrodes overlap with each other as viewed in a plan view.

Further, as shown in FIG. 1, at a portion of the scanning signal line GL where the scanning signal line GL and the video signal line DL intersect with each other, an opening portion AP is formed such that a portion of the opening portion AP overlaps with the video signal line DL. Further, the previously-mentioned connecting line LL is branched from the video signal line DL over the opening portion AP, extends to the outside of the opening portion AP (that is, to a position above the scanning signal line GL), and is connected to the drain electrode DE.

Further, in the display device according to this embodiment, cutout portions C are formed at the portion where the connecting line LL is branched from the video signal line DL. To be more specific, the cutout portions C are formed such that the cutout portions C extend in the direction approximately equal to the direction toward an intersecting point between a center line of the video signal line DL and a center line of the connecting line LL from corners which are formed by the video signal line DL and the connecting line LL. A role of the cutout portions C is explained later.

Figure 4:
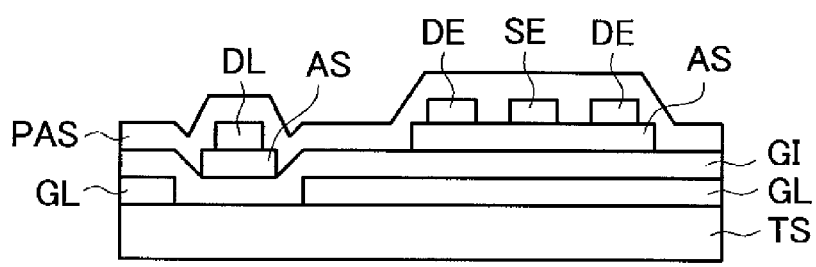
FIG. 4 is a partial cross-sectional view of the TFT substrate.
Figure 5:
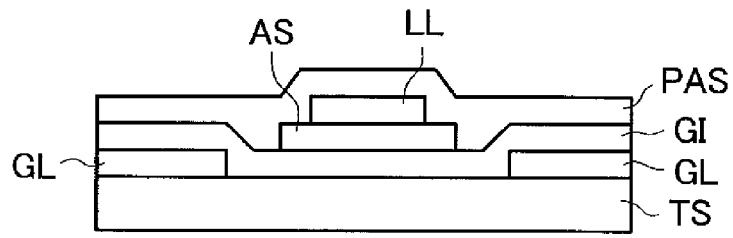
FIG. 5 is a partial cross-sectional view of the TFT substrate.

FIG. 4 is a partial cross-sectional view showing the cross-sectional structure of the TFT substrate taken along a line IV-IV in FIG. 1, and FIG. 5 is a partial cross-sectional view showing the cross-sectional structure of the TFT substrate taken along a line V-V in FIG. 1. As shown in FIG. 4 and FIG. 5, on a TFT substrate TS, the scanning signal lines GL, an insulation film GI, semiconductor layers AS, conductor layers and a protective film PAS are sequentially stacked. Here, the conductor layer is a layer which includes the video signal line DL, the connecting line LL, the drain electrode DE and the source electrode SE. Although not shown in FIG. 4 and FIG. 5, in a region where the common electrode CIT and the common signal line CL are present, the common electrode CIT and the common signal line CL are also formed on the TFT substrate TS. Further, in a region where the pixel electrode PIT is present, the pixel electrode PIT is further formed over the protective film PAS such that the pixel electrode PIT is connected with the source electrode SE.

The insulation film GI is a layer which contains a material such as silicon nitride, for example, and is formed so as to cover the scanning signal lines GL formed on the TFT substrate TS. The semiconductor layer AS is a layer which contains a material such as amorphous silicon, for example. As shown in FIG. 1, the semiconductor layer AS is formed so as to cover a region of the insulation film GI which is larger than a region where the conductor layer is formed as viewed in a plan view. That is, as shown in FIG. 4, the semiconductor layer AS is formed so as to cover the region of the insulation film GI which is larger than a region where the video signal line DL, the drain electrode DE and the source electrode SE are formed. Further, as shown in FIG. 5, the semiconductor layer AS is formed so as to cover a region of the insulation film GI which is larger than a region where the connecting line LL is formed.

In this embodiment, the explanation is made with respect to a method which manufactures the TFT substrate TS on which layers including the scanning signal lines GL, the insulation film GI, the semiconductor layers AS, the conductor layers and the protective film PAS described above are sequentially stacked. FIG. 6A to FIG. 6E are views for explaining this manufacturing method, and are partial cross-sectional views showing the cross-sectional structure of the TFT substrate TS at the same position as the TFT substrate TS shown in FIG. 4.

First of all, the scanning signal lines GL are formed on a substrate surface of the TFT substrate TS by photolithography. To be more specific, a film made of a material for forming the scanning signal lines GL is formed on the TFT substrate TS, and a film made of a resist material (resist film) is stacked on the film made of the material for forming the scanning signal lines GL. Then, the resist film is formed into a pattern corresponding to a shape of the scanning signal lines GL by exposure and development, and the scanning signal lines GL are formed by performing etching using the formed resist film as a mask. Thereafter, the remaining resist film is removed.

Figure 6A:
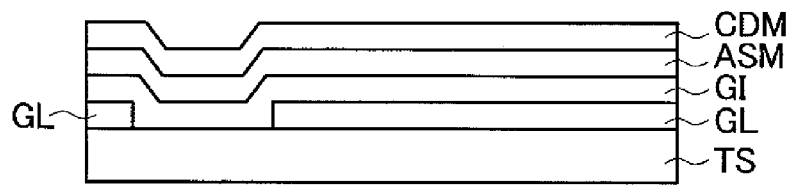
FIG. 6A to FIG. 6E are views for explaining a manufacturing method of the TFT substrate.

Next, on the substrate surface of the TFT substrate TS in such a state, the insulation film GI, a film made of a semiconductor material ASM for forming the semiconductor layers AS and a film made of a conductor material CDM for forming the conductor layers are sequentially stacked in this order. FIG. 6A shows the cross-sectional structure of the TFT substrate TS at this stage.

Figure 6B:
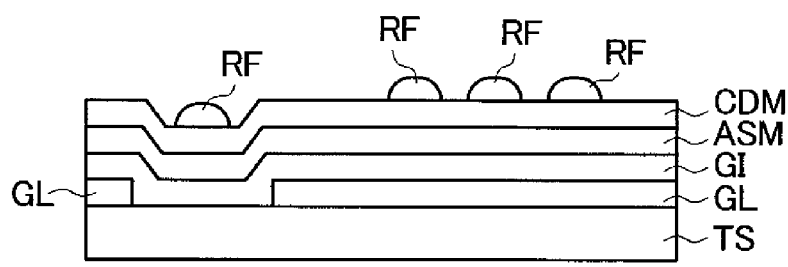

Further, with respect to the TFT substrate TS in a state shown in FIG. 6A, a resist film is formed on the film made of the conductor material CDM. Then, the conductor layer is formed by photolithography. To be more specific, the resist film is exposed using a mask pattern corresponding to a shape of the conductor layer to be formed, and the resist film is developed thus forming the resist film into a pattern corresponding to the shape of the conductor layer. FIG. 6B shows the cross-sectional structure of the TFT substrate TS at this stage. In this embodiment, the mask pattern used in the exposure of the resist film RF is set such that the previously-mentioned cutout portions C are formed at the portion where the connecting line LL is branched from the video signal line DL.

Figure 6C:
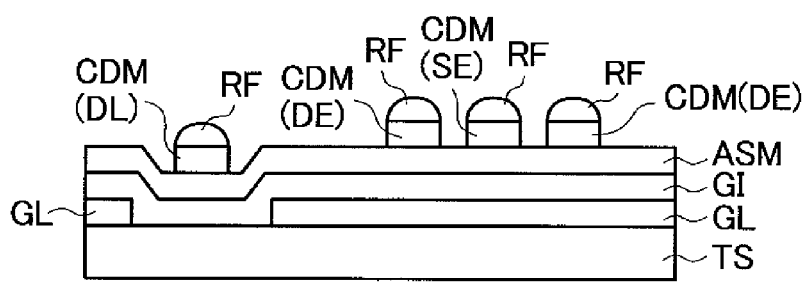

Next, in the TFT substrate TS in a state shown in FIG. 6B, the film made of the conductor material CDM is etched using the above-mentioned formed resist film RF as a mask thus forming the conductor layer which includes the video signal line DL, the connecting line LL, the drain electrode DE and the source electrode SE. FIG. 6C shows the cross-sectional structure of the TFT substrate TS at this stage.

Figure 6D:
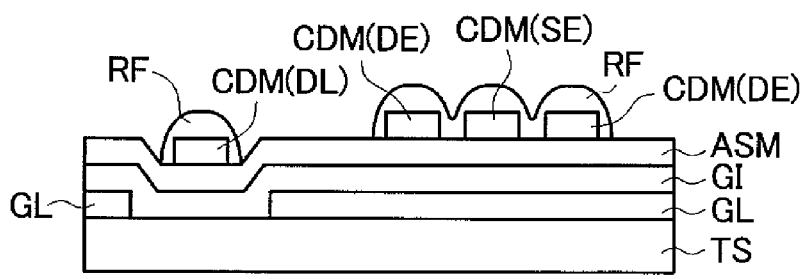

Subsequently, when the TFT substrate TS assumes a state shown in FIG. 6C due to the formation of the conductor layer, as a next step, the resist film RF remaining on the conductor layer is melted by heating. Accordingly, when the TFT substrate TS is observed in a plan view, the resist film RF assumes a state in which the resist film RF covers a region which is larger than the region where the conductor layer is formed. FIG. 6D shows the cross-sectional structure of the TFT substrate TS in a state that the resist film RF is melted.

Figure 6E:
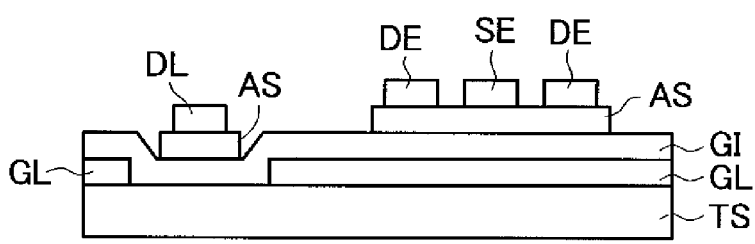

In such a state, the film made of the semiconductor material ASM is etched using the melted resist film RF as a mask. Thereafter, the remaining resist film RF is removed. Due to such a step, the semiconductor layer AS is formed so as to cover a region of the insulation film GI which is larger than a region where the conductor layer is formed. FIG. 6E shows the cross-sectional structure of the TFT substrate TS at this stage. The protective film PAS is further formed over the TFT substrate TS in such a stage so that the TFT substrate TS assumes a state shown in FIG. 4.

Figure 13:
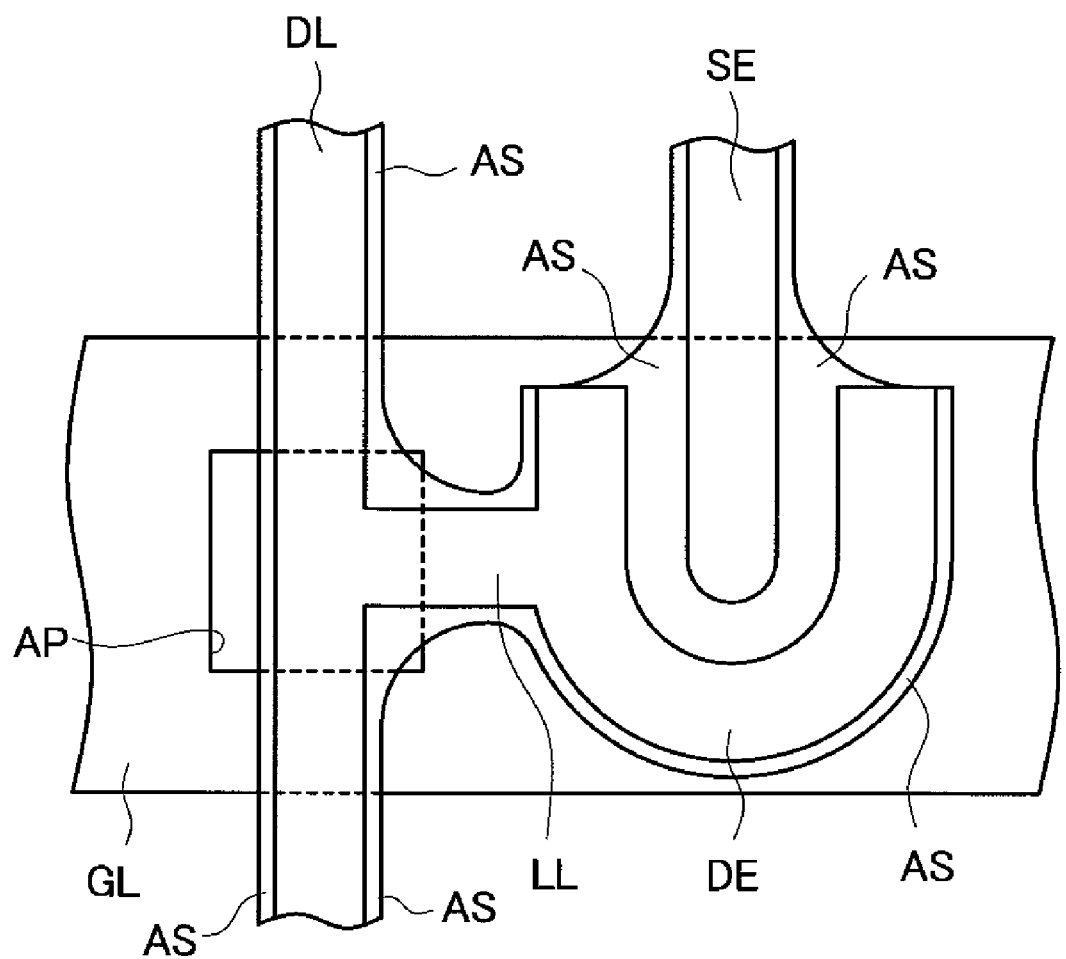
FIG. 13 is a partial plan view of a TFT substrate of a conventional display device.

Here, the resist film RF spreads due to melting thereof and hence, a width of a region of the semiconductor layer AS which projects from the conductor layer is not uniform because of the influence of a surface tension generated on the resist film RF or the like. Particularly, the resist film RF in a molten state is liable to easily collect around corners formed by the video signal line DL, the connecting line LL and the like. For example, the resist film RF in a molten state is liable to easily collect around the position where the connecting line LL is branched from the video signal line DL. Accordingly, as shown in FIG. 13, the semiconductor layer AS is liable to easily spread at the portion where the connecting line LL is branched from the video signal line DL.

In this respect, according to this embodiment, the cutout portions C are formed at the portion where the connecting line LL is branched from the video signal line DL. As explained hereinafter, the cutout portions C play a role of controlling spreading of the resist film RF in the inside of the opening portion AP when the resist film RF remaining on the conductor layer in the step of forming the semiconductor layer AS is melted.

That is, in this embodiment, when the resist film RF remaining on the conductor layer is melted, a portion of the resist film RF in a molten state flows into the cutout portions C. Accordingly, a portion of the resist film RF which is originally considered to stay in the vicinity of the portion where the connecting line LL is branched from the video signal line DL flows into the inside of the cutout portions C and hence, spreading of the resist film RF in the vicinity of the portion where the connecting line LL is branched from the video signal line DL is alleviated. As a result, it is possible to prevent the formation of the semiconductor layer AS in a state that the semiconductor layer AS spreads so as to occupy a most region of the opening portion AP on a side where the connecting line LL is arranged. According to this embodiment, it is possible to ensure the spatial tolerance in the inside of the opening portion AP when the black-spot correction is performed (when the connecting line LL is cut). Further, it is also possible to ensure the spatial tolerance in the inside of the opening portion AP when the scanning signal line GL which is short-circuited with the video signal line DL is cut off from the scanning signal lines GL bifurcated or branched by the opening portion AP.

In the example shown in FIG. 1, the cutout portion C is formed so as to stride over both of the video signal line DL and the connecting line LL. However, the cutout portion C may be formed in one of the video signal line DL or the connecting line LL. In this case, the cutout portion C may be formed at a position where a portion of the resist film RF which is originally considered to stay in the vicinity of the portion where the connecting line LL is branched from the video signal line DL flows into the cutout portion C flows into. For example, the cutout portion C may be formed within a region corresponding to the opening portion AP and in the vicinity of the portion where the connecting line LL is branched from the video signal line DL.

Second Embodiment

A display device according to the second embodiment also has the substantially equal constitution as the first embodiment (see FIG. 2 to FIG. 5), and a manufacturing method of a TFT substrate TS in the second embodiment is also substantially equal to the manufacturing method of the first embodiment (see FIG. 6) and hence, the explanation of the display device and the manufacturing method of the display device according to the second embodiment is omitted here.

Figure 7:
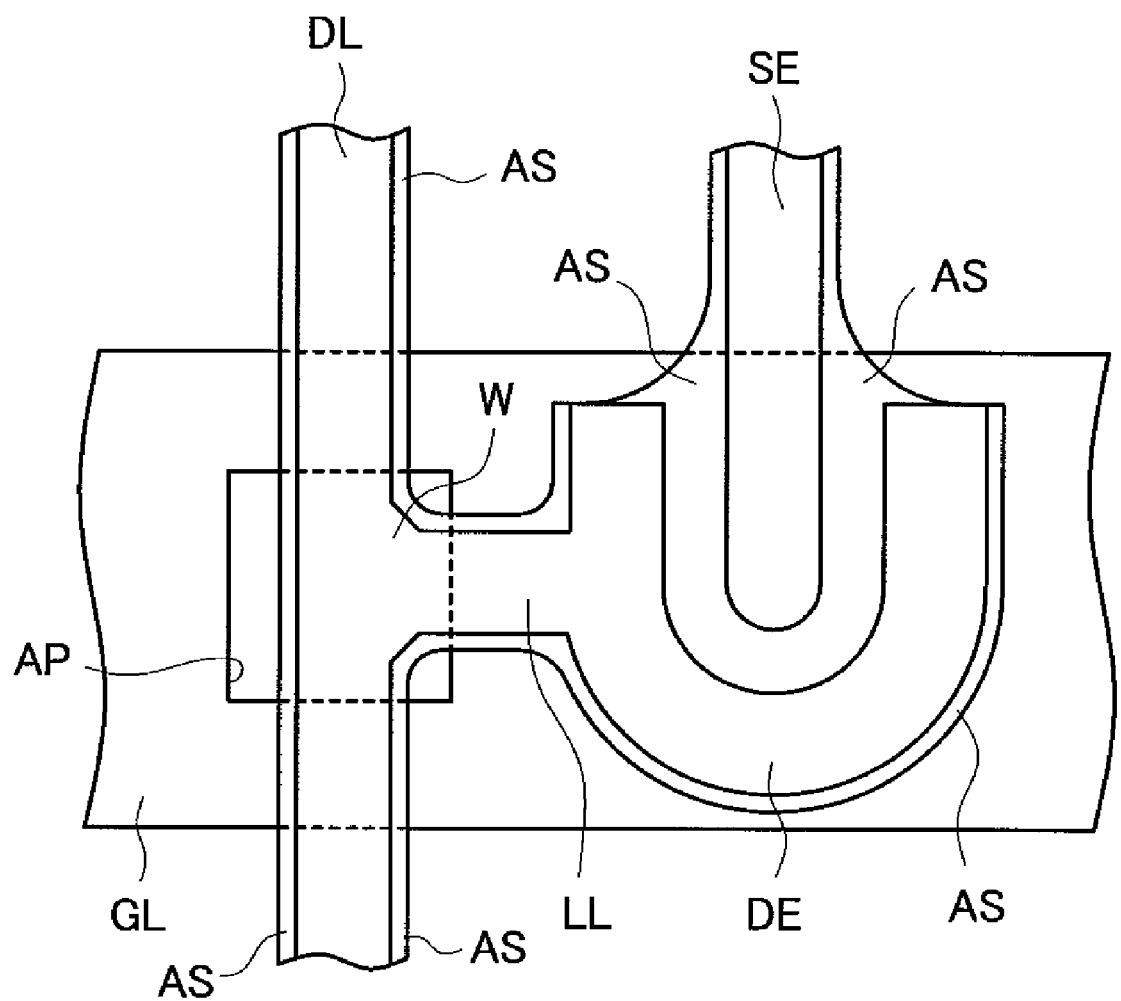
FIG. 7 is a partial plan view of a TFT substrate of a display device according to a second embodiment of the present invention.

The display device according to this embodiment differs from the display device according to the first embodiment with respect to a point that an enlarged-width portion for controlling spreading of a resist film RF in the inside of an opening portion AP when the resist film RF remaining on a conductor layer is melted in a step of forming a semiconductor layer AS is formed on a video signal line DL or/and a connecting line LL. FIG. 7 is a partial plan view of a TFT substrate TS of the display device according to this embodiment, and corresponds to FIG. 1 which shows the TFT substrate TS of the display device of the first embodiment.

As shown in FIG. 7, in the display device according to this embodiment, the enlarged-width portion W whose width is gradually increased as a width measuring point approaches the video signal line DL is formed in a region within a predetermined distance from a connecting end of the connecting line LL with the video signal line DL. Due to the formation of such an enlarged-width portion W, a corner which is formed by the video signal line DL and the connecting line LL is formed in a relatively gentle shape. Here, the enlarged-width portion W is formed such that the whole region of the opening portion AP on a side where the connecting line LL is arranged is not covered with the enlarged-width portion W. That is, the enlarged-width portion W is formed such that only a portion of the opening portion AP on a side where the connecting line LL is arranged is covered with the enlarged-width portion W.

In this embodiment, in a step of forming the conductor layer (see FIG. 6B), a mask pattern used at the time of exposing a resist film RF stacked on a conductor material CDM is set such that the above-mentioned enlarged-width portion W is formed on the connecting line LL.

When a resist film RF remaining on the conductor layer is melted in the step of forming the semiconductor layer AS, the acuter the angle made by the video signal line DL and the connecting line LL, the more the resist film RF in a molten state is liable to collect around a portion where the connecting line LL is branched from the video signal line DL. In this respect, according to this embodiment, due to the formation of the enlarged-width portion W, the angle made by the video signal line DL and the connecting line LL becomes relatively gentle and hence, the resist film RF in a molten state hardly collects around the portion where the connecting line LL is branched from the video signal line DL. Accordingly, spreading of the resist film RF at the portion where the connecting line LL is branched from the video signal line DL is alleviated and hence, it is possible to prevent the formation of the semiconductor layer AS in a state that the semiconductor layer AS spreads so as to occupy a most region of the opening portion AP on a side where the connecting line LL is arranged. Also according to this embodiment, it is possible to ensure the spatial tolerance in the inside of the opening portion AP when the black-spot correction is performed. Further, it is also possible to ensure the spatial tolerance in the inside of the opening portion AP when the scanning signal line GL short-circuited with the video signal line DL is separated out of the scanning signal lines GL bifurcated or branched by the opening portion AP.

The example shown in FIG. 7 may be expressed such that the enlarged-width portion W is formed on the video signal line DL. That is, the example shown in FIG. 7 may be also expressed such that the enlarged-width portion W whose width is gradually increased toward the extending direction of the connecting line LL as a width measuring point approaches a branching position of the connecting line LL is formed on the video signal line DL. Further, the example shown in FIG. 7 is also expressed such that the enlarged-width portion W is formed so as to stride over the video signal line DL and the connecting line LL.

Third Embodiment

A display device according to the third embodiment also has the substantially equal constitution as the first embodiment (see FIG. 2 to FIG. 5), and a manufacturing method of a TFT substrate TS in the third embodiment is also substantially equal to the manufacturing method of the first embodiment (see FIG. 6) and hence, the explanation of the display device and the manufacturing method of the TFT substrate TS according to the third embodiment is omitted here.

Figure 8:
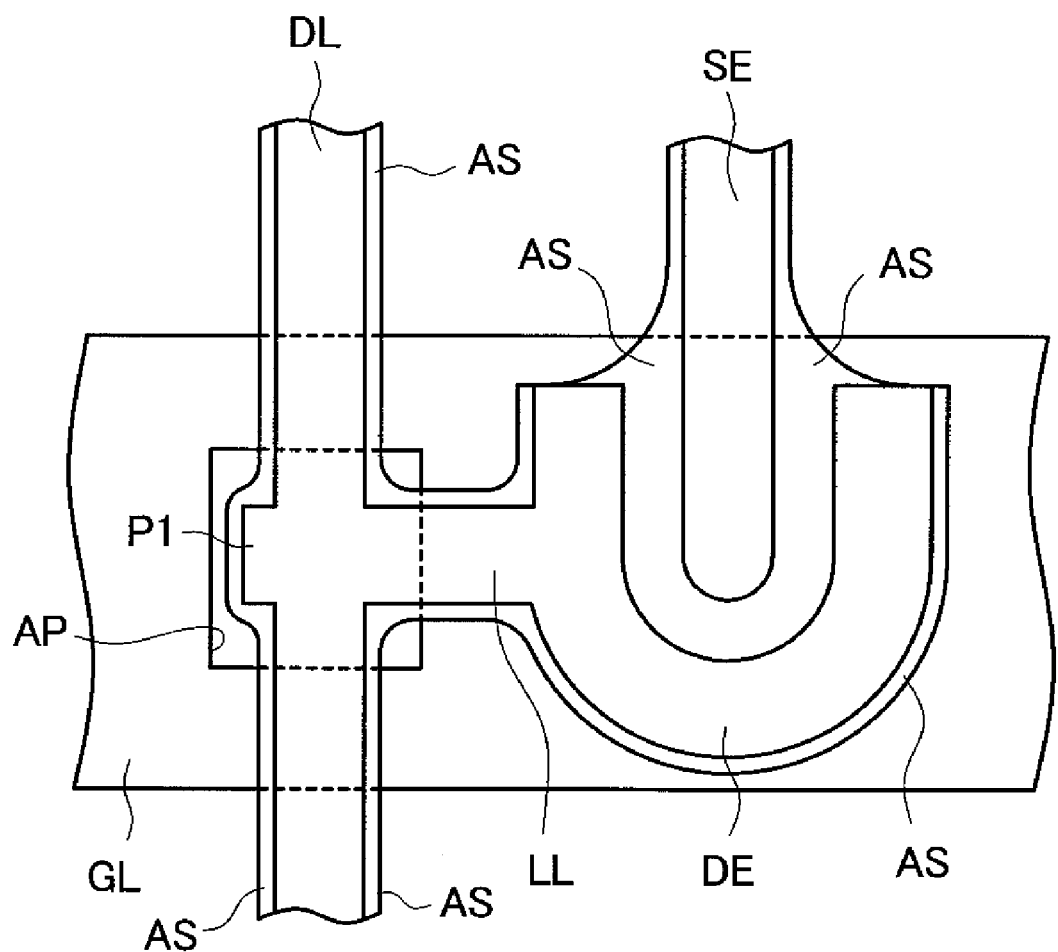
FIG. 8 is a partial plan view of a TFT substrate of a display device according to a third embodiment of the present invention.

The display device according to this embodiment differs from the display device according to the first embodiment with respect to a point that a projecting portion for controlling spreading of a resist film RF in the inside of an opening portion AP when the resist film RF remaining on a conductor layer is melted in a step of forming a semiconductor layer AS is formed on a video signal line DL. FIG. 8 is a partial plan view of a TFT substrate TS of the display device according to this embodiment, and corresponds to FIG. 1 which shows the TFT substrate TS of the display device of the first embodiment.

As shown in FIG. 8, in the display device according to this embodiment, the projecting portion P1 is formed on the video signal line DL on a side opposite to a side where a connecting line LL is connected to the video signal line DL. In this embodiment, in a step of forming the conductor layer (see FIG. 6B), a mask pattern used at the time of exposing a resist film RF stacked on a conductor material CDM is set such that the above-mentioned projecting portion P1 is formed on the video signal line DL.

In this embodiment, when a resist film RF remaining on the conductor layer is melted in the step of forming the semiconductor layer AS, the resist film RF in a molten state is also liable to collect in the vicinity of the projecting portion P1. Accordingly, a portion of the resist film RF which is originally considered to flow into a region of the opening portion AP on a side where the connecting line LL is arranged also flows into a region of the opening portion AP on a side where the connecting line LL is not arranged. As a result, spreading of the resist film RF to the region of the opening portion AP where the connecting line LL is arranged is decreased. Accordingly, it is possible to prevent the formation of the semiconductor layer AS in a state that the semiconductor layer AS spreads so as to occupy a most region of the opening portion AP on a side where the connecting line LL is arranged. Also according to this embodiment, it is possible to ensure the spatial tolerance in the inside of the opening portion AP when the black-spot correction is performed. Further, it is also possible to ensure the spatial tolerance in the inside of the opening portion AP when the scanning signal line GL short-circuited with the video signal line DL is separated out of the scanning signal lines GL bifurcated or branched by the opening portion AP.

In the example shown in FIG. 8, the projecting portion P1 is arranged at a position where the projecting portion P1 makes a line symmetry with respect to the connecting line LL and the video signal line DL. However, the position of the projecting portion P1 is not limited to the position where the projecting portion P1 makes a line symmetry with respect to the connecting line LL and the video signal line DL. That is, the projecting portion P1 may be formed at a position which allows a portion of the resist film RF which is originally considered to flow into a region of the opening portion AP on a side where the connecting line LL is arranged to collect. For example, the projecting portion P1 may be formed at a position on a side of the video signal line DL opposite to a side where the connecting line LL is connected and within or in the vicinity of a region of the video signal line DL which corresponds to the opening portion AP. Further, in the example shown in FIG. 8, the projecting direction of the projecting portion P1 is taken in the direction substantially opposite to the extending direction of the connecting line LL. However, it is not always necessary to set the projecting direction of the projecting portion P1 to the direction substantially opposite to the extending direction of the connecting line LL. Further, in the example shown in FIG. 8, a width of the projecting portion P1 is set substantially equal to a width of the connecting line LL as viewed in a plan view. However, a width of the projecting portion P1 may not be substantially equal to the width of the connecting line LL.

Fourth Embodiment

A display device according to the fourth embodiment also has the substantially equal constitution as the first embodiment (see FIG. 2 to FIG. 5), and a manufacturing method of a TFT substrate TS in the fourth embodiment is also substantially equal to the manufacturing method of the first embodiment (see FIG. 6) and hence, the explanation of the display device and the manufacturing method of the TFT substrate TS according to the fourth embodiment is omitted here.

Figure 9:
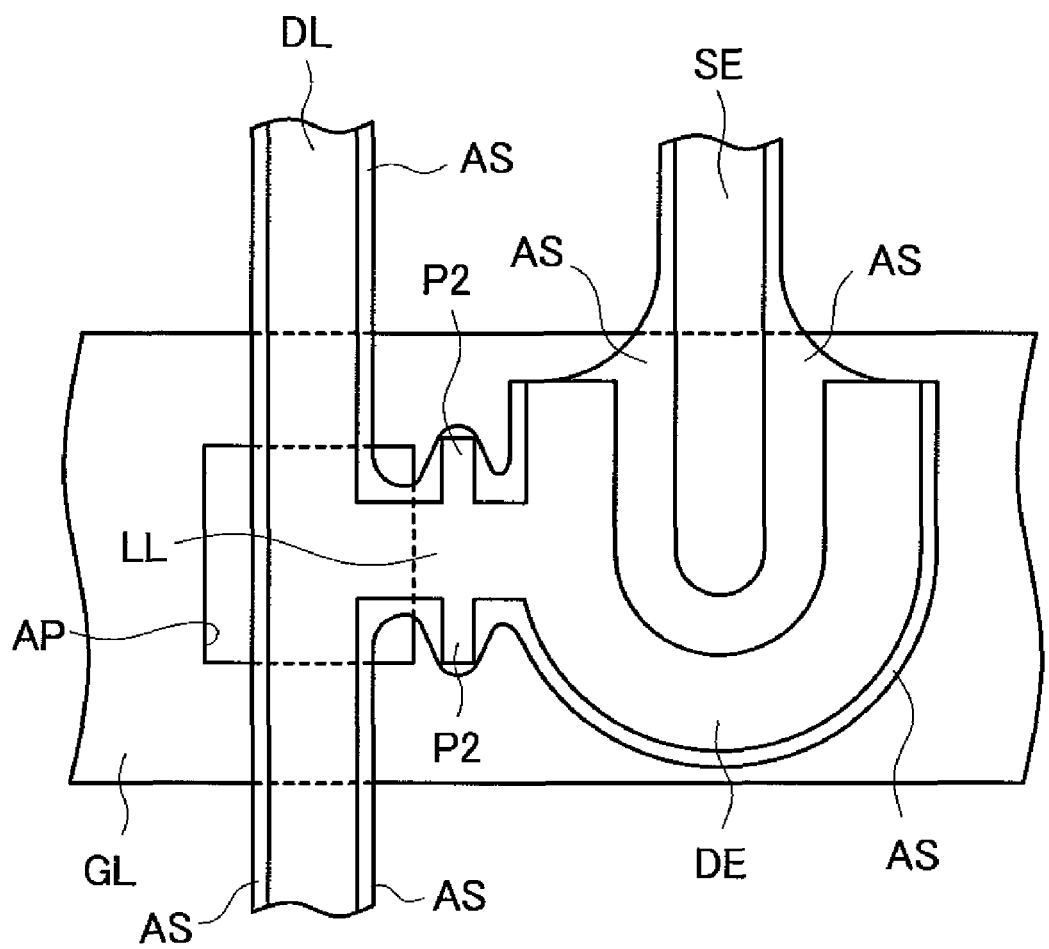
FIG. 9 is a partial plan view of a TFT substrate of a display device according to a fourth embodiment of the present invention.

The display device according to this embodiment differs from the display device according to the first embodiment with respect to a point that projecting portions for controlling spreading of a resist film RF in the inside of an opening portion AP when the resist film RF remaining on a conductor layer is melted in a step of forming a semiconductor layer AS are formed on a connecting line LL. FIG. 9 is a partial plan view of a TFT substrate TS of the display device according to this embodiment, and corresponds to FIG. 1 which shows the TFT substrate TS of the display device of the first embodiment.

As shown in FIG. 9, in the display device according to this embodiment, projecting portions P2 are formed on the connecting line LL outside a region of the connecting line LL corresponding to the opening portion AP and at a position in the vicinity of the opening portion AP. In this embodiment, in a step of forming the conductor layer (see FIG. 6B), a mask pattern used at the time of exposing a resist film RF stacked on a conductor material CDM is set such that the above-mentioned projecting portions P2 are formed on the connecting line LL.

When a resist film RF remaining on the conductor layer is melted in the step of forming the semiconductor layer AS, the resist film RF in a molten state is liable to collect around corners formed by a video signal line DL, the connecting line LL and the like. In this respect, according to this embodiment, the above-mentioned projecting portions P2 are formed on the connecting line LL and hence, the resist film RF in a molten state is also liable to collect around areas in the vicinity of the projecting portions P2. As a result, a portion of the resist film RF which is originally considered to stay in the inside of a region of the opening portion AP on a side where the connecting line LL is arranged stays outside the opening portion AP. Accordingly, spreading of the resist film RF in the region of the opening portion AP on a side where the connecting line LL is arranged is decreased and hence, it is possible to prevent the formation of the semiconductor layer AS in a state that the semiconductor layer AS spreads so as to occupy a most region of the opening portion AP on a side where the connecting line LL is arranged. Also according to this embodiment, it is possible to ensure the spatial tolerance in the inside of the opening portion AP when the black-spot correction is performed. Further, it is also possible to ensure the spatial tolerance in the inside of the opening portion AP when the scanning signal line GL short-circuited with the video signal line DL is separated out of the scanning signal lines GL bifurcated or branched by the opening portion AP.

Here, in the example shown in FIG. 9, the projecting direction of the projecting portions P2 is set in the direction substantially orthogonal to the extending direction of the connecting line LL. However, it is not always necessary to set the projecting direction of the projecting portions P2 in the direction orthogonal to the extending direction of the connecting line LL.

Fifth Embodiment

A display device according to the fifth embodiment also has the substantially equal constitution as the first embodiment (see FIG. 2 to FIG. 5), and a manufacturing method of a TFT substrate TS in the fifth embodiment is also substantially equal to the manufacturing method of the first embodiment (see FIG. 6) and hence, the explanation of the display device and the manufacturing method of the TFT substrate TS according to the fifth embodiment is omitted here.

Figure 10:
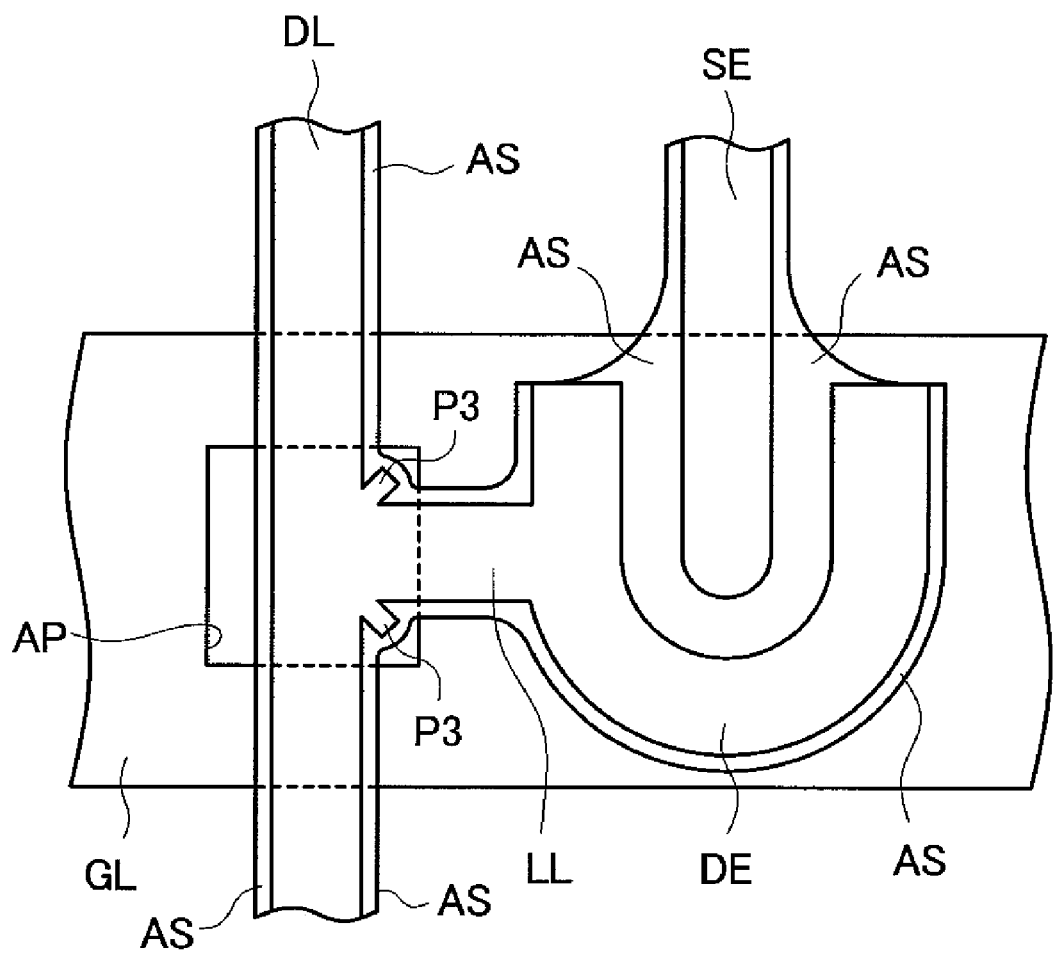
FIG. 10 is a partial plan view of a TFT substrate of a display device according to a fifth embodiment of the present invention.

The display device according to this embodiment differs from the display device according to the first embodiment with respect to a point that projecting portions for controlling spreading of a resist film RF in the inside of an opening portion AP when the resist film RF remaining on a conductor layer is melted in a step of forming a semiconductor layer AS are formed at a portion where a connecting line LL is branched from a video signal line DL. FIG. 10 is a partial plan view of a TFT substrate TS of the display device according to this embodiment, and corresponds to FIG. 1 which shows the TFT substrate TS of the display device of the first embodiment.

As shown in FIG. 10, in the display device according to this embodiment, projecting portions P3 are formed at the portion where the connecting line LL is branched from the video signal line DL. In this embodiment, in a step of forming the conductor layer (see FIG. 6B), a mask pattern used at the time of exposing a resist film RF stacked on a conductor material CDM is set such that the above-mentioned projecting portions P3 are formed at the portion where the connecting line LL is branched from the video signal line DL.

When a resist film RF remaining on the conductor layer is melted in the step of forming the semiconductor layer AS, the resist film RF in a molten state is liable to collect around corners formed by a video signal line DL, the connecting line LL and the like. In this respect, according to this embodiment, the projecting portions P3 are formed at the portion where the connecting line LL is branched from the video signal line DL and hence, the resist film RF in a molten state is also liable to collect around the portion where the connecting line LL is branched from the video signal line DL. That is, the resist film RF which is considered to spread to a region of the opening portion AP on a side where the connecting line LL is arranged collects more around the portion where the connecting line LL is branched from the video signal line DL. As a result, spreading of the resist film RF in the region of the opening portion AP on a side where the connecting line LL is arranged is decreased and hence, it is possible to prevent the formation of the semiconductor layer AS in a state that the semiconductor layer AS spreads so as to occupy a most region of the opening portion AP on a side where the connecting line LL is arranged. Also according to this embodiment, it is possible to ensure the spatial tolerance in the inside of the opening portion AP when the black-spot correction is performed. Further, it is also possible to ensure the spatial tolerance in the inside of the opening portion AP when the scanning signal line GL short-circuited with the video signal line DL is separated out of the scanning signal lines GL bifurcated or branched by the opening portion AP.

The present invention is not limited to the embodiments explained heretofore.

Figure 11:
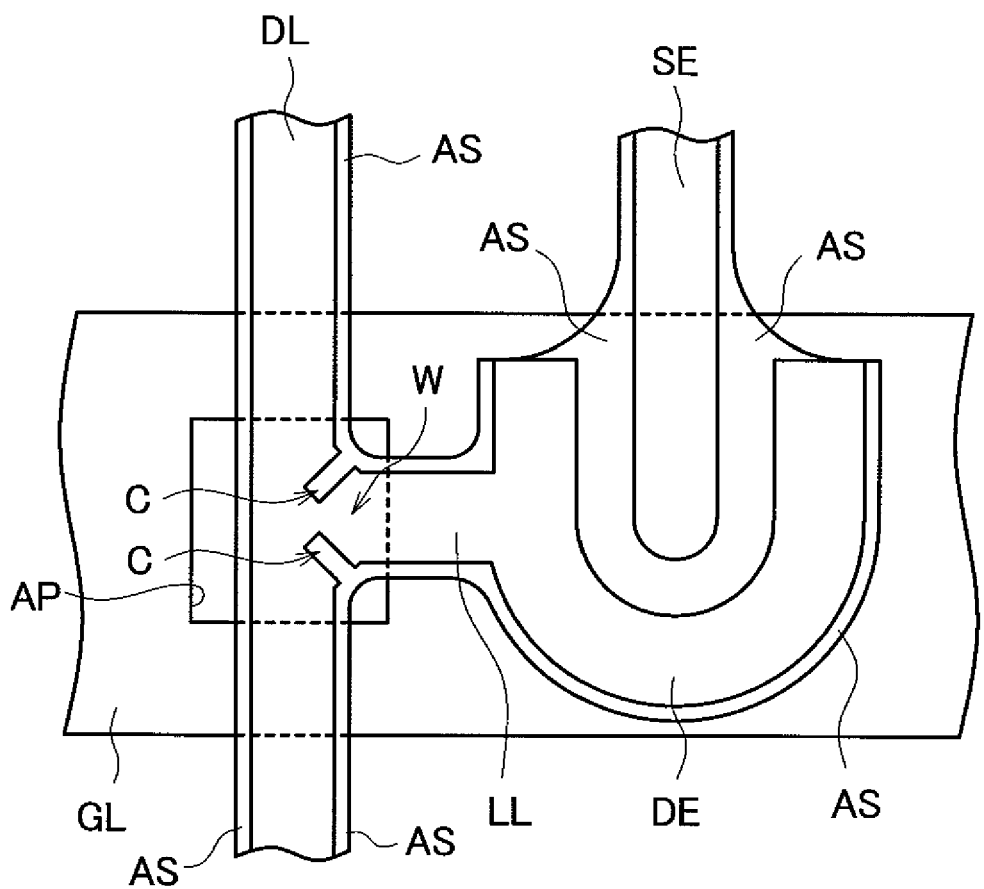
FIG. 11 is a partial plan view of a TFT substrate of a display device according to another embodiment of the present invention.
Figure 12:
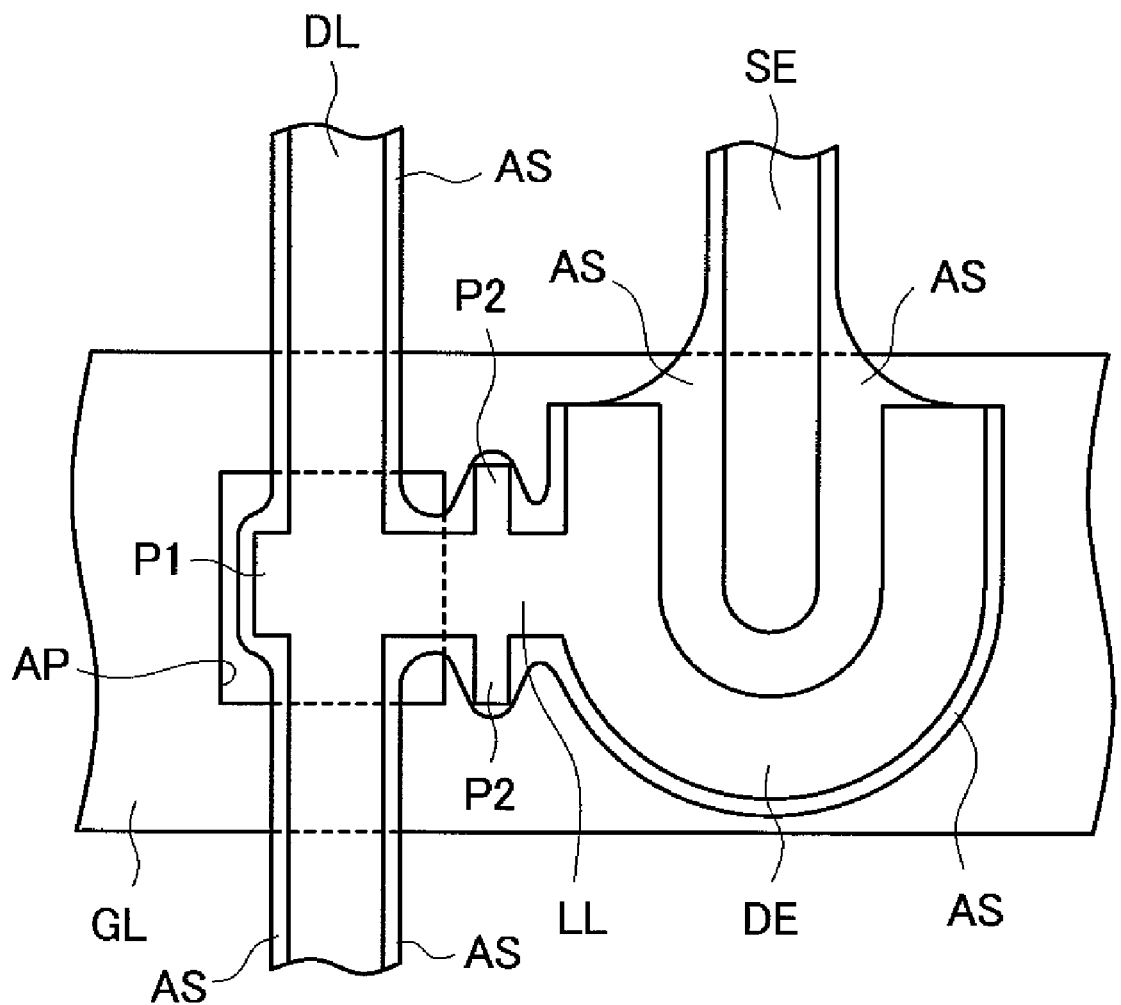
FIG. 12 is a partial plan view of a TFT substrate of a display device according to another embodiment of the present invention.

For example, a plurality of embodiments selected from the first to fifth embodiments may be combined with each other. FIG. 11 shows an example which is the combination of the first embodiment and the second embodiment, and FIG. 12 shows an example which is the combination of the third embodiment and the fourth embodiment. Due to such combinations, it is possible to further decrease spreading of the resist film RF in the region of the opening portion AP on a side where the connecting line LL is arranged when the resist film RF remaining on the conductor layer is melted.

Further, for example, the example in which the present invention is applied to the so-called IPS-type liquid crystal display device has been explained heretofore. That is, the explanation has been made with respect to the example in which the present invention is applied to the display device which adopts a method in which liquid crystal molecules are controlled using a lateral electric field generated between the pixel electrode PIT and the common electrode CIT formed on the TFT substrate TS. However, the present invention is also applicable to a display device which adopts other method. For example, the present invention is also applicable to a so-called VA (Vertical Alignment)-type liquid crystal display device. That is, the present invention is also applicable to a liquid crystal display device which adopts a method in which liquid crystal molecules are controlled using a vertical electric field generated between a pixel electrode PIT formed on a TFT substrate TS and a counter electrode formed on a filter substrate. Further, the present invention is also applicable to a so-called TN (Twisted Nematic)-type liquid crystal display device. Still further, the present invention is also applicable to a display device other than the liquid crystal display device, for example. That is, in other display device such as an organic EL display device, for example, when a thin film transistor is provided to every pixel, such a display device also has a task to be solved substantially equal to the above-mentioned task.

What is claimed is:

1. A display device in which scanning signal lines, an insulation film, semiconductor layers, and conductor layers are sequentially stacked on a substrate, wherein
   the conductor layer includes a video signal line which intersects the scanning signal line via the insulation film, a drain electrode and a source electrode of a thin film transistor, and a connecting line which connects the video signal line and either one of the drain electrode and the source electrode,
   the semiconductor layer is formed so as to cover at least a region of the insulation film which is larger than a region where the video signal line and the connecting line are formed,
   an opening portion is formed in the scanning signal line such that the opening portion overlaps with a portion of the video signal line,
   the connecting line is connected with the video signal line over the opening portion, extends to the outside of the opening portion, and is connected to either one of the drain electrode and the source electrode, and
   a cutout portion, a projecting portion or an enlarged-width portion is formed on the video signal line and/or the connecting line in a region which corresponds to the opening portion or in the vicinity of the region.

2. A display device according to claim 1, wherein the cutout portion is formed in a connecting portion which connects the video signal line and the connecting line.

3. A display device according to claim 1, wherein the projecting portion is formed on the video signal line on a side opposite to a side where the connecting line is connected to the video signal line.

4. A display device according to claim 1, wherein the projecting portion is formed on the connecting line outside the region which corresponds to the opening portion and in the vicinity of the opening portion.

5. A display device according to claim 1, wherein the projecting portion is formed at a connecting portion which connects the video signal line and the connecting line.

6. A display device according to claim 1, wherein the enlarged-width portion which gradually increases a width thereof toward the video signal line is formed on the connecting line in a region within a predetermined distance from a connecting end of the connecting line with the video signal line.

7. A manufacturing method of a display device comprising the steps of:

forming conductor layers each of which includes a video signal line which intersects with a scanning signal line by way of an insulation film, a drain electrode and a source electrode of a thin film transistor and a connecting line which connects the video signal line with either one of the drain electrode and the source electrode by etching a conductor material for forming the conductor layer using a resist material which is formed by patterning on a stacked structure which is formed by sequentially stacking the scanning signal line, the insulation film, a semiconductor material for forming semiconductor layer and the conductor material on a substrate; and forming the semiconductor layer by melting the resist material remaining on the conductor layer after forming the conductor layer, and by etching the semiconductor material using the resist material in a molten state as a mask, wherein an opening portion is formed in the scanning signal line such that the opening portion overlaps with a portion of the video signal line, the connecting line is connected with the video signal line over the opening portion, and extends to the outside of the opening portion and is connected to either one of the drain electrode and the source electrode, and the resist material is formed by patterning such that the video signal line or/and the connecting line includes a cutout portion, a projecting portion or an enlarged-width portion for controlling spreading of the resist material in the opening portion when the resist material is melted.

8. A manufacturing method of a display device according to claim 7, wherein the resist material is formed by patterning such that the cutout portion is formed in a connecting portion which connects the video signal line and the connecting line.

9. A manufacturing method of a display device according to claim 7, wherein the resist material is formed by patterning such that the projecting portion is formed on the video signal line on a side opposite to a side where the connecting line is connected to the video signal line.

10. A manufacturing method of a display device according to claim 7, wherein the resist material is formed by patterning such that the projecting portion is formed on the connecting line outside the region which corresponds to the opening portion and in the vicinity of the opening portion.

11. A manufacturing method of a display device according to claim 7, wherein the resist material is formed by patterning such that the projecting portion is formed at a connecting portion which connects the video signal line and the connecting line.

12. A manufacturing method of a display device according to claim 7, wherein the resist material is formed by patterning such that the enlarged-width portion which gradually increases a width thereof toward the video signal line is formed in a region within a predetermined distance from a connecting end of the connecting line with the video signal line.

* * * * *